United States Patent
Dey et al.

(10) Patent No.: US 9,893,517 B2
(45) Date of Patent: Feb. 13, 2018

(54) ELECTROSTATIC DISCHARGE PROTECTION CIRCUITRY

(71) Applicant: ARM Limited, Cambridge (GB)

(72) Inventors: Ranabir Dey, Bangalore (IN); Abhinav Kumar, Bangalore (IN); Vijaya Kumar Vinukonda, Bangalore (IN); Fabrice Blanc, Grenoble (FR)

(73) Assignee: ARM Limited, Cambridge (GB)

( * ) Notice: Subject to any disclaimer, the term of this patent is extended or adjusted under 35 U.S.C. 154(b) by 476 days.

(21) Appl. No.: 14/570,142

(22) Filed: Dec. 15, 2014

(65) Prior Publication Data

US 2016/0172350 A1    Jun. 16, 2016

(51) Int. Cl.
  *H02H 9/00*  (2006.01)
  *H02H 9/04*  (2006.01)
  *H01L 29/78* (2006.01)
  *H01L 27/02* (2006.01)

(52) U.S. Cl.
  CPC ......... *H02H 9/046* (2013.01); *H01L 27/0285* (2013.01); *H01L 29/78* (2013.01)

(58) Field of Classification Search
  CPC .................................................. H02H 9/046
  USPC .......................................................... 361/56
  See application file for complete search history.

(56) References Cited

U.S. PATENT DOCUMENTS

| 7,221,551 B2 * | 5/2007 | Chen | H01L 27/0266 |
| | | | 361/111 |
| 8,724,269 B2 * | 5/2014 | Wang | H02H 9/046 |
| | | | 361/56 |

OTHER PUBLICATIONS

Loiseau, et al.; "Stacked Power Clamp Design Challenges"; International ESD Workshop; 2014.
Melikyan, et al.; "5V Tolerant Power Clamps for Mixed-Voltage IC's in 65nm 2.5V Salicided CMOS Technology"; East-West Design & Test Symposium (EWDTS); pp. 434-437; IEEE; Sep. 2010. DOI: 10.1109/EWDTS.2010.5742097.
Ker, et al.; "ESD Protection Design with On-Chip ESD Bus and High-Voltage Tolerant ESD Clamp Circuit for Mixed-Voltage I/O Buffers"; IEEE Transactions on Electron Devices; vol. 55, Issue 6; pp. 1409-1416; Jun. 2008. DOI: 10.1109/TED.2008.920972.

(Continued)

*Primary Examiner* — Stephen W Jackson
(74) *Attorney, Agent, or Firm* — Pramudji Law Group PLLC; Ari Pramudji

(57) ABSTRACT

Various implementations described herein are directed to an integrated circuit for electrostatic discharge (ESD) protection. The integrated circuit may include a detection stage having a resistor and a first capacitor cascaded with a second capacitor. The resistor and the first capacitor are arranged to define a triggering node configured to provide a triggering signal. The first capacitor and the second capacitor are arranged to define a reference node configured to provide a reference signal. The integrated circuit may include a first ESD clamping stage having a first transistor configured to provide a supply voltage to a first clamping transistor based on the triggering signal. The integrated circuit may include a second ESD clamping stage having a second transistor configured to receive the supply voltage from the first transistor and provide the supply voltage to a second clamping transistor based on the reference signal.

18 Claims, 5 Drawing Sheets

(56) References Cited

OTHER PUBLICATIONS

Notermans, et al.; "Designing HV Active Clamps for HBM Robustness"; 29th Electrical Overstress/Electrostatic Discharge Symposium; pp. 1B.1-1-1B.1-6; IEEE; Sep. 2007. DOI: 10.1109/EOSESD.2007.4401730.

Ker, et al.; "Design on Power-Rail ESD Clamp Circuit for 3.3-V I/O Interface by Using Only 1-V/2.5-V Low Voltage Devices on a 130-nm CMOS Process" IEEE Transaction on Circuits and Systems; vol. 53, No. 10; pp. 2187-2193; Oct. 10, 2006. DOI: 10.1109/TCSI.2006.882818.

Ker, et al.; "ESD Protection for Mixed-Voltage I/O in Low-Voltage Thin-Oxide CMOS"; ISSCC 2006, Session 29; IEEE; Feb. 2006. DOI: 10.1109/ISSCC.2006.1696284.

Maloney, et al.; "Stacked PMOS Clamps for High Voltage Power Supply Protection"; Electrical Overstress/Electrostatic Discharge Symposium Proceedings; pp. 70-77; IEEE; Sep. 1999. DOI: 10.1109/EOSESD.1999.818992.

\* cited by examiner

ELECTROSTATIC DISCHARGE PROTECTION CIRCUITRY

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Integrated circuits include functional circuitry to perform processing functions along with interface circuitry (such as input/output (I/O) circuitry) for providing interfaces between functional circuitry and components external to the integrated circuit.

Integrated circuits are subject to electrostatic sources, and therefore it may be necessary to protect functional circuitry from electrostatic sources. Protection may be achieved by incorporating electrostatic protection circuits.

SUMMARY

Described herein are various implementations of an integrated circuit. In one implementation, the integrated circuit may include a resistor-capacitor (RC) detection stage having a resistor and a first capacitor cascaded with a second capacitor. The resistor and the first capacitor may be arranged to define a triggering node that provides a RC triggering signal. The first capacitor and the second capacitor may be arranged to define a reference node that provides a reference signal. The integrated circuit may include a first electrostatic discharge (ESD) clamping stage having a first transistor configured to provide a supply voltage to a first clamping field effect transistor (FET) based on the RC triggering signal from the triggering node. The integrated circuit may include a second ESD clamping stage having a second transistor configured to receive the supply voltage from the first transistor and provide the supply voltage to a second clamping FET based on the reference signal from the reference node.

Described herein are various implementations of an ESD protection circuit. In one implementation, the ESD protection circuit may include a detection stage configured to provide a supply voltage to a top-gate node based on a RC triggering voltage and configured to provide the supply voltage to a bottom-gate node via the top-gate node based on a reference voltage. The ESD protection circuit may include a clamping stage configured to provide a first ESD clamp in response to receiving the supply voltage from the top-gate node and configured to provide a second ESD clamp in response to receiving the supply voltage from the bottom-gate node. The ESD protection circuit may include a coupling capacitor interposed between the bottom-gate node and the top-gate node. The coupling capacitor may be configured to receive the supply voltage from the top-gate node to the bottom-gate node.

Described herein are further implementations of an ESD protection circuit. In one implementation, the ESD protection circuit may include a detection stage configured to provide a supply voltage to a top-gate node based on a RC triggering voltage and configured to provide the supply voltage to a bottom-gate node via the top-gate node based on a reference voltage. The ESD protection circuit may include a clamping stage configured to provide a first ESD clamp in response to receiving the supply voltage from the top-gate node. The clamping stage may be configured to provide a second ESD clamp in response to receiving the supply voltage from the bottom-gate node. The ESD protection circuit may include a regulating transistor configured to receive the supply voltage from the top-gate node and add the supply voltage to the reference voltage based on the RC triggering voltage.

The above referenced summary section is provided to introduce a selection of concepts in a simplified form that are further described below in the detailed description section. The summary is not intended to identify key features or essential features of the claimed subject matter, nor is it intended to be used to limit the scope of the claimed subject matter. Moreover, the claimed subject matter is not limited to implementations that solve any or all disadvantages noted in any part of this disclosure.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Generally, mixed power supply I/O circuitry uses ESD protection schemes in gate oxide devices within their reliable safe operating conditions. In some cases, each gate oxide thickness may typically add an additional process step and cost during the chip manufacturing. Sometimes, only two-gate oxide thickness is offered in a given CMOS technology, such as a thin oxide (first oxide) for core circuitry and a thick oxide (second oxide) for I/O circuitry. For these devices, the I/O voltage options may include HV option of 3.3V, MV option of 2.5V, and LV option of 1.8V.

Another approach may be to cascade two LV (1.8V) power rail ESD protection circuits for use with HV (3.3V) and MV (2.5V) power supply. However, this may only be possible for SOI (Silicon-on-Insulator) or triple-well process, because an upper 1.8V ESD circuit (NMOS ground/body) should be isolated from a bottom 1.8V ESD circuit. If a foundry does not support triple-well or SOI, then an architecture may be used where an upper NMOS BigFET connects wells to DVSS instead of REFN, or where a lower NMOS transistor is replaced by a resistor. These architectures may not be efficient, and clamp voltage may rise to an over-voltage state, e.g., as high as 3.5V or more. Further, in some of these approaches, merely stacking ESD clamps may slow response time and degrade ESD clamping efficiency. To improve performance in clamping efficiency and to reduce manufacturing costs or prevent manufacturing constraints (e.g., when IO oxide thickness should not be forced by a few HV-capable IO on a SoC), LV gate-oxide devices may be used for HV power supply domains with proper circuit techniques to avoid stress and leakage on these low operating devices due to high voltage.

Various implementations described herein refer to and are directed to circuitry for electrostatic discharge (ESD) protection. For instance, in one implementation, such ESD protection circuitry may include a resistor-capacitor (RC) detection stage having circuit components arranged to provide a supply voltage to a clamping stage based on one or more triggering signals. Further, the ESD protection circuitry may include the clamping stage configured to provide ESD clamping based on the one or more triggering signals from the RC detection stage. As such, the ESD protection circuitry may be implemented with multiple stages.

Various implementations of ESD protection circuitry described herein will now be described in more detail with reference to FIGS. 1-5.

Figure 1:
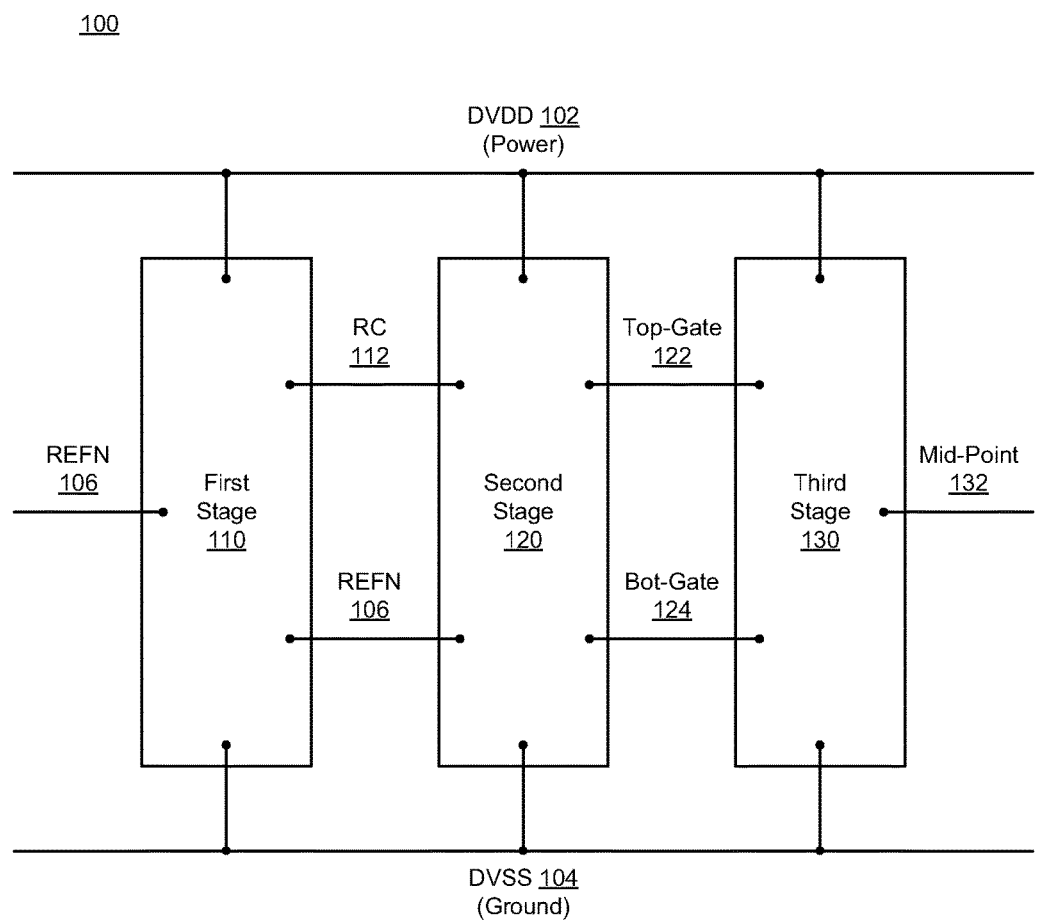
FIG. 1 illustrates a block diagram of electrostatic discharge (ESD) protection circuitry in accordance with various implementations described herein.

FIG. 1 illustrates a block diagram of electrostatic discharge (ESD) protection circuitry 100 in accordance with various implementations described herein. The ESD protection circuitry 100 may be implemented with multiple stages. The ESD protection circuitry 100 may be referred to as ESD circuitry and/or an ESD circuit.

The circuitry 100 may include a first bus 102 configured to provide a supply voltage DVDD. The first bus 102 may be referred to as a first voltage rail for supplying power (i.e., the supply voltage DVDD) to the ESD protection circuit from an input voltage source. The circuitry 100 may include a second bus 104 configured to provide a ground voltage DVSS. The second bus 104 may be referred to as a second voltage rail for providing the ground voltage DVSS to the ESD protection circuit. The circuitry 100 may be configured to receive a reference input voltage signal 106 as a reference voltage REFN from external circuitry. In various implementations, the supply voltage DVDD provides a first power supply voltage, and the reference voltage REFN provides a second power supply voltage less than the first power supply voltage.

Figure 2:
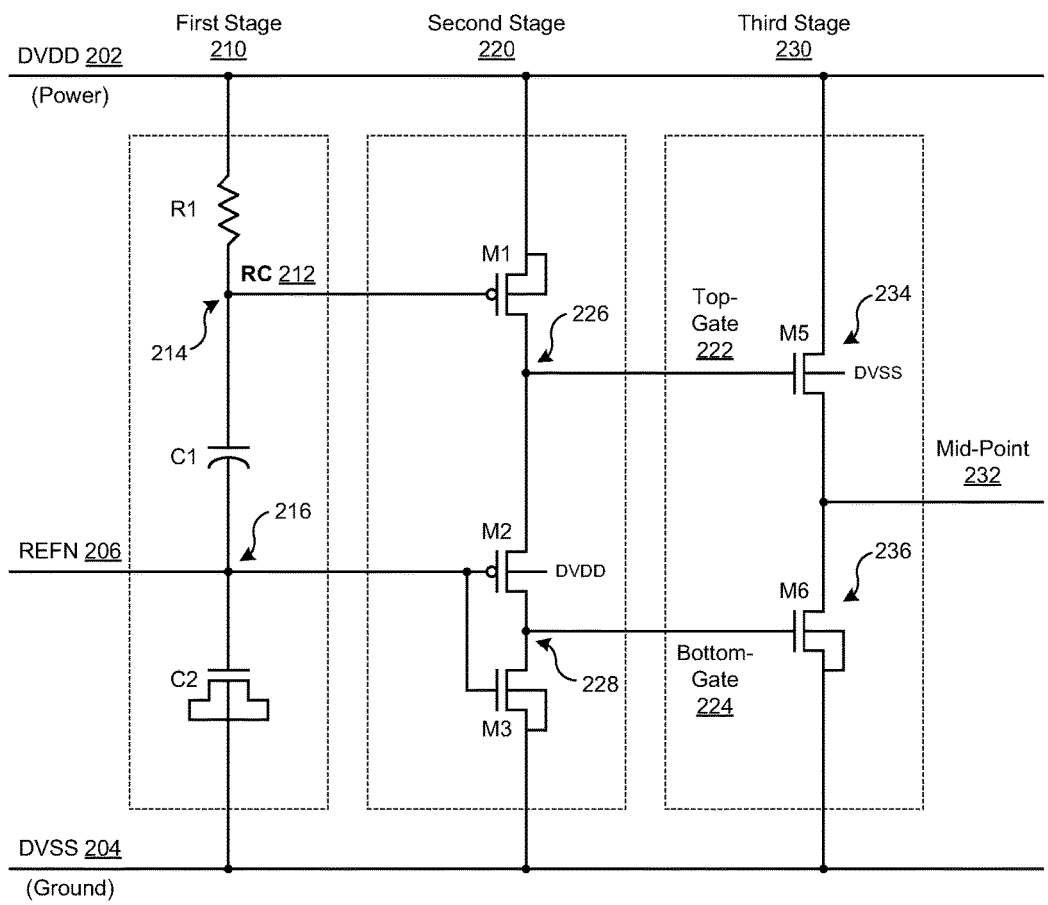
FIGS. 2-4 illustrate diagrams of ESD protection circuits in accordance with various implementations described herein.

The ESD protection circuitry 100 may include multiple stages including a first stage 110, a second stage 120, and a third stage 130. As shown in FIG. 2, these stages may be implemented in a parallel manner. However, alternative implementations may be used to achieve similar results.

The first stage 110 may include a detection stage interposed between the first bus 102 for connection to the supply voltage DVDD and the second bus 104 for connection to the ground voltage DVSS. The first stage 110 may be configured to provide a resistor-capacitor (RC) triggering voltage 112 and the reference voltage 106 to the second stage 120. The first stage 110 may be configured to provide the supply voltage DVDD to a top-gate 122 via the second stage 120 based on the RC triggering voltage 112. The first stage 110 may be configured to provide the supply voltage DVDD from the top-gate 122 to a bottom-gate 124 (i.e., bot-gate) via the second stage 120 based on the reference voltage REFN.

The third stage 130 may include a clamping stage configured to provide ESD clamping based on receiving the supply voltage DVDD from the top-gate 122. The third stage 130 may also be configured to provide additional ESD clamping based on receiving the supply voltage DVDD from the bottom-gate 124. The third stage 130 may define a mid-point node 132, which is further described herein.

In various implementations, the supply voltage DVDD may be configured to provide a first power supply voltage within a range of approximately 0V-3.3V, and the reference voltage REFN may provide a second power supply voltage within a range of approximately 1V-1.8V. As described herein, each of the stages may be configured to utilize one or more circuit components that may be configured for operating with one or more of the first and second power supply voltages.

In various implementations, the ESD circuitry and circuits described herein provide an over-voltage RC triggered power-rail ESD clamp (3.3/2.5/1.8V) using 1.8V complementary metal-oxide-semiconductor (CMOS) devices. The ESD circuitry/circuits provided herein enable ESD protection of a high voltage (HV) and/or a medium voltage (MV) power supply in manufacturing technologies where only low voltage (LV) devices are available. As such, the ESD circuitry/circuits provided herein enable HV input/output (I/O) signaling. The ESD circuitry/circuits provided herein provide voltages across all of the transistors' terminals in a stacked ESD clamp type configuration that may be limited to sufficiently low values to ensure sufficient lifetime and reliability. Further, the ESD circuitry/circuits provided herein provide an architecture that uses a capacitive coupling along with an active charging path that assists with turning on a lower n-type metal-oxide-semiconductor (NMOS) clamp faster for better clamping efficiency. Still further, the ESD circuitry/circuits provided herein provide clamp circuit architecture that enables to achieve a suitable voltage control (within devices reliability limits) without contacting a middle node (mid-point) 132 of the stack. In some instances, these technologies may enable some layout area saving in manufacturing.

FIG. 2 illustrates a diagram of an ESD protection circuit 200 in accordance with various implementations described herein. As shown in FIG. 2, the ESD protection circuit 200 may be implemented with multiple stages and may be referred to as ESD circuitry and/or a ESD circuit.

In some instances, the ESD protection circuit 200 may be referred to as a stacked ESD clamp having a mixed voltage rating, such as, for example, of at least one of a HV rating of, e.g., approximately 3.3V, a MV rating of, e.g., approximately 2.5V, and a LV rating of, e.g., approximately 1.8V. As such, in various implementations, the ESD protection circuit 200 provides an active mixed voltage (3.3V, 2.5V, 1.8V) ESD clamp for LV (1.8V) technologies.

The circuit 200 may include a first bus 202 configured to provide a supply voltage DVDD. The circuit 200 may include a second bus 204 configured to provide a ground voltage DVSS. The circuit 200 may be configured to receive a reference input voltage signal 206 as a reference voltage REFN from external circuitry. The reference voltage REFN is provided at the reference node 216 to ensure better reliability.

Figure 3:
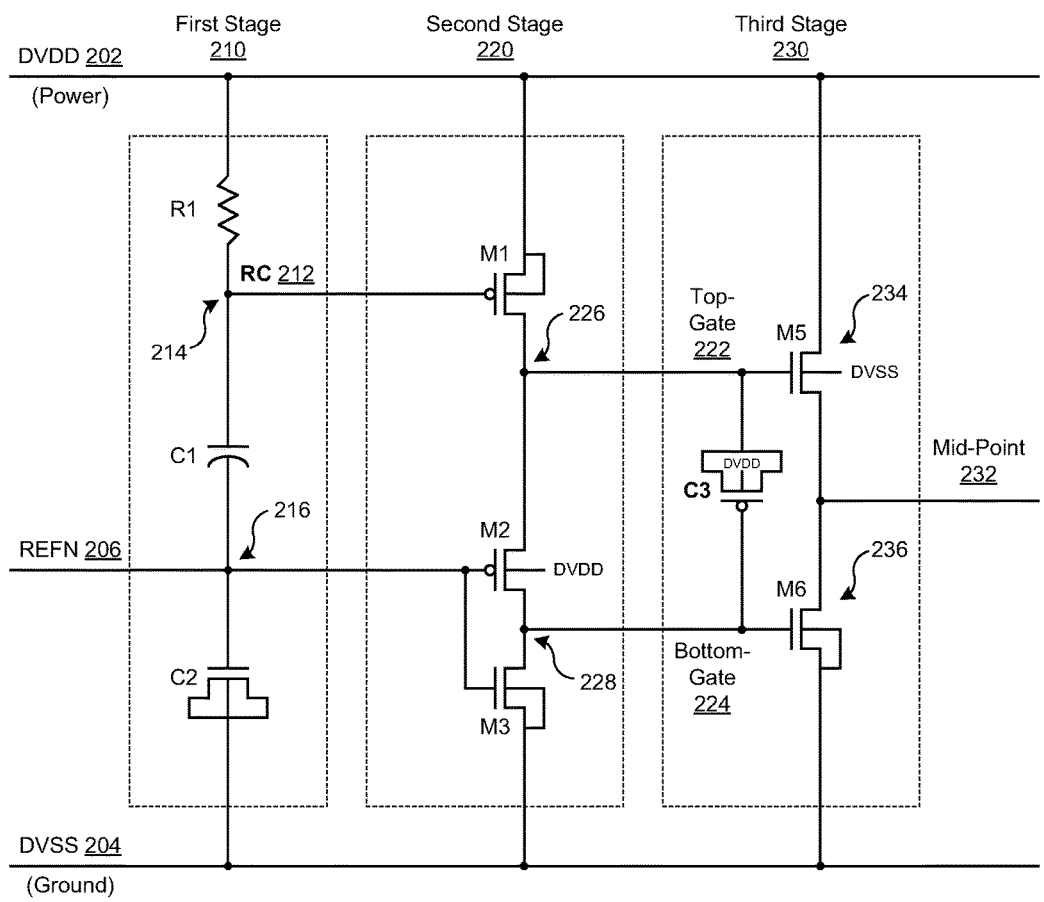

The ESD protection circuit 200 may include an integrated circuit with multiple stages including a first stage 210, a second stage 220, and a third stage 230. As shown in FIG. 3, these stages may be implemented in a parallel manner.

The first stage 210 may include a RC detection stage having a resistor R1 and a first capacitor C1 cascaded with a second capacitor C2. The resistor R1 and the first capacitor C1 may be arranged to define a triggering node 214 that provides a RC triggering signal 212. The first capacitor C1 and the second capacitor C2 may be arranged to define a reference node 216 that provides the reference voltage REFN.

In various implementations, the resistor R1, the first capacitor C1, and/or the third capacitor C3 may be sized to achieve the various operating conditions described herein. For instance, the resistor R1 may comprise a high-R resistor. The first capacitor C1 may comprise an n-type metal-oxide-semiconductor (NMOS) in N-well capacitance. The second capacitor C2 may comprise a NMOS transistor interconnected to function as a capacitor.

The second stage 220 may include a first transistor M1 configured to provide the supply voltage DVDD to a top-gate node 226 based on the RC triggering signal 212 from the triggering node 214. The second stage 220 may include a second transistor M2 configured to receive the supply voltage DVDD from the first transistor M1 and provide the supply voltage DVDD to a bottom-gate node 228 based on the reference voltage REFN from the reference node 216.

The second stage may include a third transistor M3. The third transistor M3 may be configured to remain a high impedance path to ground under the ESD condition. However, it is configured to provide the ground voltage DVSS to the bottom gate based on the reference voltage REFN from the reference node 206 in non-ESD condition (which may also be referred to as normal operating condition) when transistor M6 should be turned off and no direct current path exists from DVDD and DVSS.

The third stage 230 may include a first ESD clamping stage 234 and a second ESD clamping stage 236. The first ESD clamping stage 234 may include a first clamping field effect transistor (FET) M5 and a second clamping FET M6. The first ESD clamping stage 234 may employ the first transistor M1 to provide the supply voltage DVDD to the first clamping FET M5 based on the RC triggering signal 212 from the triggering node 214. The second ESD clamping stage 236 may employ the second transistor M2 to provide the supply voltage DVDD to the second clamping FET M6 based on the reference voltage REFN from the reference node 216. In this instance, the second transistor M2 may receive the supply voltage DVDD from the first transistor M1 and provide the supply voltage DVDD to the second clamping FET M6 based on the reference voltage REFN from the reference node 216.

The first clamping FET M5 may comprise an n-type metal-oxide-semiconductor NMOS field effect transistor (FET), NMOS-FET. The second clamping FET M6 may also comprise a NMOS-FET. The first and second NMOS-FETs M5 and M6 may be referred to as Big FETS, i.e., these transistors M5 and M6 may be larger in size and may use more space on silicon than a conventional MOSFET.

The third stage 230 may define a mid-point node 232 interposed between the first clamping FET M5 and the second clamping FET M6. The clamp circuit architecture of the third stage 230 may be configured to enable suitable voltage control (e.g., within M5, M6 device reliability limits) without contacting the mid-point node 232 of the stacked first and second clamping FETs M5, M6.

In various implementations, the supply voltage DVDD provides a first power supply voltage, and the reference voltage REFN may provide a second power supply voltage less than the first power supply voltage. Each of the first and second ESD clamping FETs M5, M6 utilize circuit components configured for operating with the first and second power supply voltages DVDD, REFN. In some implementations, the supply voltage DVDD may be configured to provide a first power supply voltage within a range of approximately 0V-3.3V, and the reference voltage REFN to provide a second power supply voltage within a range of approximately 0V-1.8V.

In some implementations, the supply voltage comprises a high voltage (HV) power supply voltage having an upper boundary voltage of approximately 3.3V, and the reference voltage REFN comprises a low voltage (LV) power supply voltage having an upper boundary voltage of approximately 1.8V. Further, in some implementations, each of the first and second ESD clamping FETs M5, M6 may utilize LV circuit components configured for operating with an upper boundary voltage of approximately 1.8V.

In some implementations, the supply voltage comprises a medium voltage (MV) power supply voltage having an upper boundary voltage of approximately 2.5V, and the reference voltage REFN comprises a low voltage (LV) power supply having an upper boundary voltage of 1.8V. Further, in some implementations, each of the first and second ESD clamping FETs M5, M6 may utilize LV circuit components configured for operating with having an upper boundary voltage of approximately 1.8V.

In some implementations, the supply voltage comprises a low voltage (LV) power supply voltage having an upper boundary voltage of approximately 1.8V, and the reference voltage REFN comprises a low voltage (LV) power supply voltage having an upper boundary voltage of approximately 1.8V. Further, in some implementations, each of the first and second ESD clamping FETs M5, M6 may utilize LV circuit components configured for operating with an upper boundary voltage of approximately 1.8V.

The top-gate node 226 may be defined between the first transistor M1 and the second transistor M2. During gate activation, the first transistor M1 may be configured to provide the supply voltage DVDD to the first clamping FET M5 via the top-gate node 226 along a top-gate line 222. The second transistor M2 may be configured to receive the supply voltage DVDD from the first transistor M1 via the top-gate node 226.

A bottom-gate node 228 may be defined between the second transistor M2 and the third transistor M3. The second transistor M2 may be configured to provide the supply voltage DVDD to the second clamping FET M6 via the bottom-gate node 228 along a bottom-gate line 224.

Each of the first and second transistors M1, M2 may comprise a p-type metal-oxide-semiconductor (PMOS) transistor. The third transistor may comprise an n-type metal-oxide-semiconductor (NMOS) transistor. Each of the first and second clamping FETs M5, M6 may comprise a n-type metal-oxide-semiconductor (NMOS) FET.

FIG. 3 illustrates a diagram of an ESD protection circuit 300 in accordance with various implementations described herein.

In one implementation, the ESD protection circuit 300 of FIG. 3 comprises the ESD protection circuit 200 of FIG. 2 with incorporation of a third capacitor C3 in the third stage 230. As described herein, the third capacitor C3 may be referred to as a coupling capacitor that couples the bottom-gate 224 to the top-gate 222. As further described herein, the ESD protection circuit 300 provides another active mixed voltage (3.3V, 2.5V, 1.8V) ESD clamp for LV (1.8V) technologies.

The third capacitor C3 may be referred to as a coupling capacitor that couples the second clamping FET M6 with the first clamping FET M5. For instance, the third capacitor C3 may be interposed between a gate of the second clamping FET M6 and a gate of the first clamping FET M5. The third capacitor C3 may be connected between the bottom-gate line 224 and the top-gate line 222, so as to be configured to create an additional path other than the active transistor M2 path to pass DVDD from the top gate to the bottom gate. The addition of the third capacitor C3 may ensure that the bottom gate receives DVDD faster than it was receiving when only M2 assisted the charging of the bottom gate from the top gate. In some instances, the third capacitor C3 may be implemented in a manner to optimize over-voltage ESD clamping and to assist with increasing clamping efficiency of the first and second clamping FETs M5, M6.

The third capacitor C3 may comprise a p-type metal-oxide-semiconductor (PMOS) transistor interconnected to function as a capacitor. The third capacitor C3 may be implemented in a manner that allows the bottom-gate 224 to charge faster. In some implementations, the third capacitor C3 may comprise a capacitance of approximately one-half (½) of the capacitance of the second capacitor C2. In other implementations, the third capacitor C3 may comprise a capacitance that does not exceed the capacitance of C2.

In some implementations, a combination of the first and second stages 210, 220 may be referred to as a detection stage. The detection stage may be configured to provide the supply voltage DVDD to the top-gate node 226 based on the RC triggering voltage 212, which may be referred to as a RC triggering signal. The detection stage may be configured to provide the supply voltage DVDD from the top-gate node 226 to the bottom-gate node 228 based on the reference voltage REFN, which may be referred to as a reference signal.

In some implementations, a combination of the second and third stages 220, 230 may be referred to as a clamping stage. The clamping stage may be configured to provide a first ESD clamp (e.g., via the first clamping FET M5) based on receiving the supply voltage DVDD from the top-gate node 226. The clamping stage may be configured to provide a second ESD clamp (e.g., via the second clamping FET M6) based on receiving the supply voltage DVDD from the bottom-gate node 228.

As shown in FIG. 3, the third capacitor C3 may be implemented as a coupling capacitor between the bottom-gate line 224 and the top-gate line 222. Based on this coupling, the third capacitor C3 may be configured to receive the supply voltage DVDD from the top-gate line 222 to the bottom-gate line 224.

Figure 4:
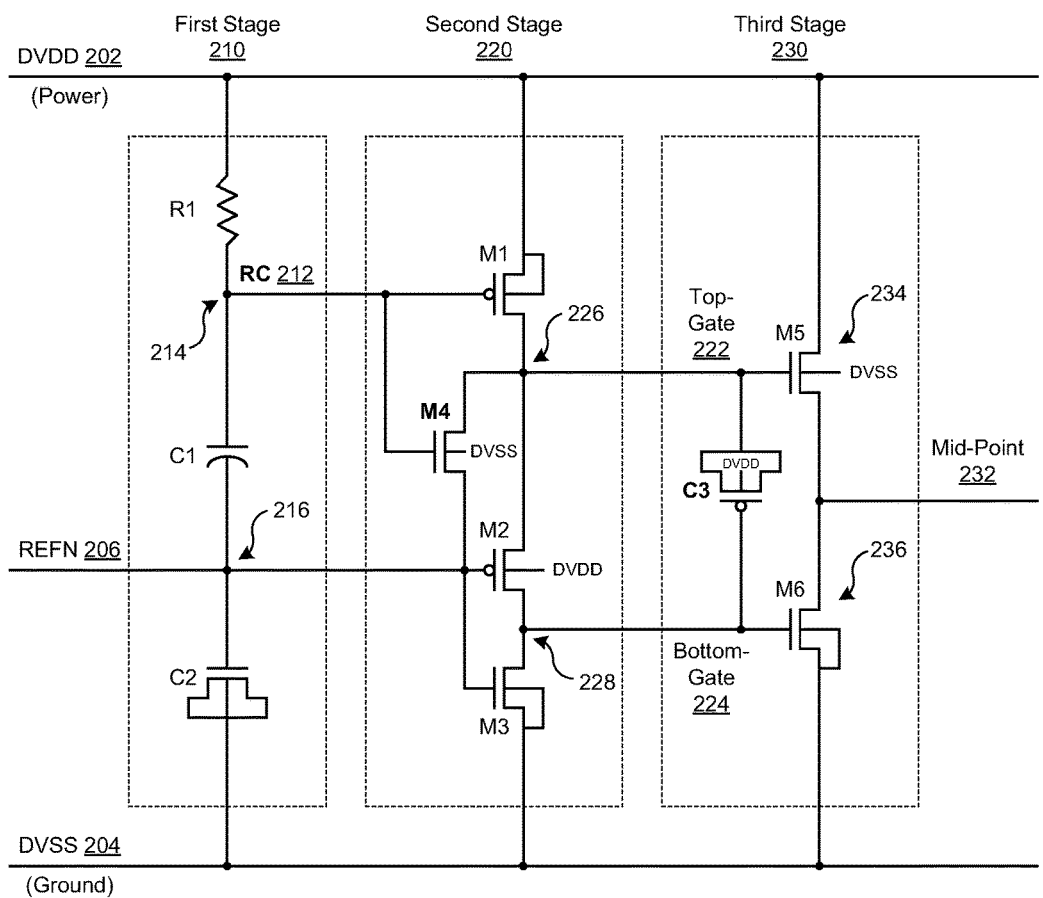

FIG. 4 illustrates a diagram of an ESD protection circuit 400 in accordance with various implementations described herein.

In one implementation, the ESD protection circuit 400 of FIG. 4 comprises the ESD protection circuit 300 of FIG. 3 with incorporation of a fourth transistor M4 in the second stage 220. As described herein, the fourth transistor M4 may be referred to as a regulating transistor that may be used to improve reliability. As further described herein, the ESD protection circuit 400 provides another active mixed voltage (3.3V, 2.5V, 1.8V) ESD clamp for LV (1.8V) technologies.

The fourth transistor M4 may also regulate the voltage at top gate line 222 to near REFN value at note 206. During normal operating condition when there is no ESD voltage, the top-gate node 226 may become as high as one |Vthp| value higher than REFN; e.g., it may become as high as 2.3V when REFN is 1.8V and |Vthp| of transistor M2 is 0.5V. In non-ESD condition, the bottom-gate line 224 may be close to DVSS or zero Volts. This may cause the gate-to-source voltage or gate-to-drain voltage of the capacitor C3 to exceed a technology boundary value; in this case of 1.8V, possibly causing a reliability issue. The fourth transistor M4 may be configured to receive the REFN voltage, which is 1.8V in this case from node 216 to the top-gate node 226 in non-ESD condition, thus restricting the gate-to-source voltage and the gate-to-drain voltage of the capacitor C3. In some implementations, the size of the transistor M4 may be selected so that during ESD condition, the transistor M4 may not conduct significant current when compared to the M2 and C3 coupling currents, thus possibly not degrading the ESD efficiency.

The fourth transistor M4 may comprise an n-type metal-oxide-semiconductor (NMOS) transistor. The fourth transistor M4 may be implemented as a weak NMOS to make the top-gate voltage the same as REFN during non-ESD condition. The fourth transistor M4 may be fabricated to a size that does not disturb the supply voltage DVDD. The fourth transistor M4 may be fabricated to a similar size as the second transistor M2. In some implementations, the fourth transistor M4 may be configured to make sure that the third capacitor C3 receives 1.8V by making the REFN node 216 to near DVSS (e.g., near 0V).

In some implementations, a combination of the first and second stages 210, 220 may be referred to as a detection stage. The detection stage may be configured to provide the supply voltage DVDD to the top-gate node 226 based on the RC triggering voltage 212, which may be referred to as a RC triggering signal. The detection stage may be configured to provide the supply voltage DVDD from the top-gate node 226 to the bottom-gate node 228 based on the reference voltage REFN, which may be referred to as a reference signal.

In some implementations, a combination of the second and third stages 220, 230 may be referred to as a clamping stage. The clamping stage may be configured to provide a first ESD clamp (e.g., via the first clamping FET M5) based on receiving the supply voltage DVDD from the top-gate node 226. The clamping stage may be configured to provide a second ESD clamp (e.g., via the second clamping FET M6) based on receiving the supply voltage DVDD from the bottom-gate node 228.

In some implementations, the third capacitor C3 may be interposed between the bottom-gate line 224 and the top-gate line 222. The third capacitor C3 (coupling capacitor) may be configured to receive the supply voltage DVDD from the bottom-gate line 224 via the bottom-gate node 228. Further, the fourth transistor M4 (which may be referred to as a regulating transistor) may be configured to receive the supply voltage DVDD from the top-gate node 226 and add the supply voltage DVDD to the reference voltage REFN based on the RC triggering voltage 212.

Figure 5:
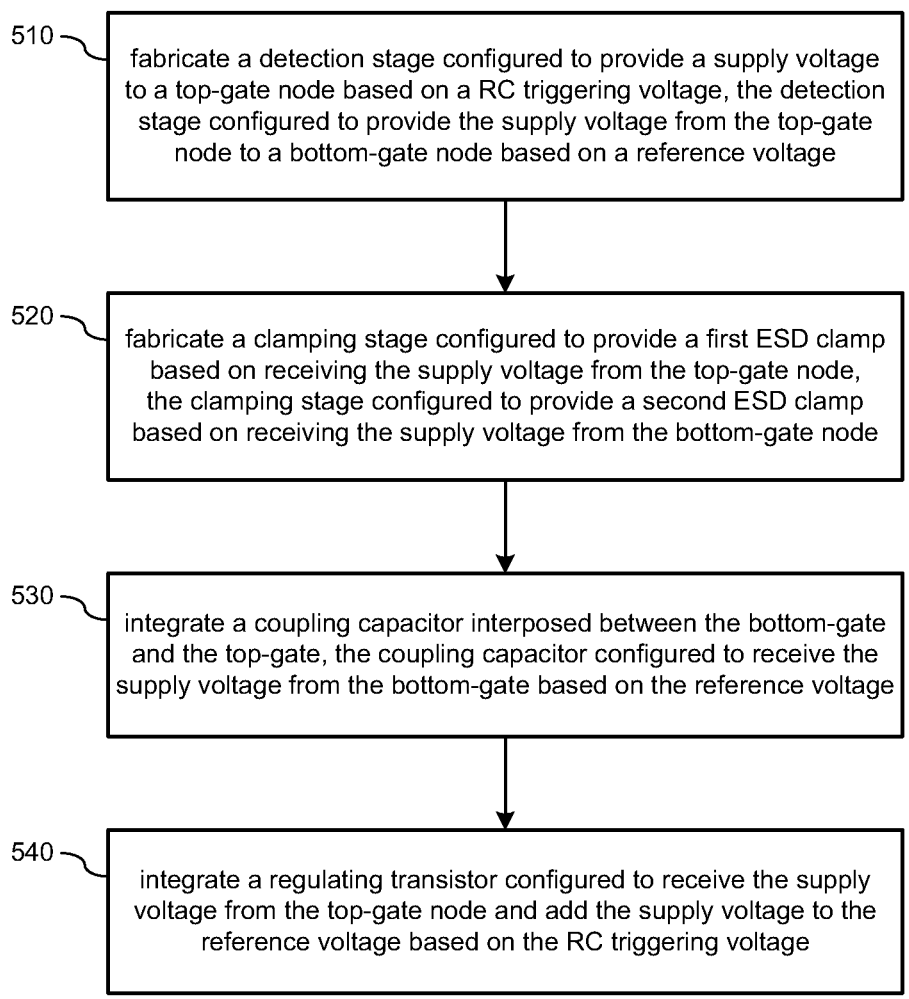
FIG. 5 illustrates a process flow diagram for a method of manufacture of an ESD protection circuit in accordance with various implementations described herein.

FIG. 5 illustrates a process flow diagram for a method of manufacture of an ESD protection circuit in accordance with various implementations described herein.

It should be understood that while method 500 indicates a particular order of execution of operations, in some examples, certain portions of the operations might be executed in a different order, and on different systems. In some other examples, one or more additional operations and/or steps may be added to method 500. Similarly, some operations and/or steps may be omitted.

Steps 510-520 are described with reference to FIG. 2. At block 510, method 500 may fabricate a detection stage configured to provide a supply voltage (e.g., DVDD) to a top-gate node (e.g., 226) based on a RC triggering voltage (e.g., RC). The detection stage may be configured to provide the supply voltage (e.g., DVDD) from the top-gate node (e.g., 226) to a bottom-gate node (e.g., 228) based on a reference voltage (e.g., REFN).

In some implementations, the detection stage may be fabricated to include a first stage (e.g., 210) having a resistor (e.g., R1), a first capacitor (e.g., C1), and a second capacitor (e.g., C2). The resistor (e.g., R1) and the first capacitor (e.g., C1) may be arranged to provide the RC triggering voltage (e.g., RC). The first capacitor (e.g., C1) and the second capacitor (e.g., C2) may be arranged to provide the reference voltage (e.g., REFN).

In some implementations, the detection stage may be fabricated to include a second stage (e.g., 220) having a first transistor (e.g., M1), a second transistor (e.g., M2), and a third transistor (e.g., M3). The first transistor (e.g., M1) may be configured to provide the supply voltage (e.g., DVDD) to the top-gate node (e.g., 226) based on the RC triggering voltage (e.g., RC). The second transistor (e.g., M2) may be configured to receive the supply voltage (e.g., DVDD) from the top-gate node (e.g., 226) and provide the supply voltage (e.g., DVDD) to the bottom-gate node (e.g., 228) based on the reference voltage (e.g., REFN). The third transistor (e.g., M3) may be configured to receive the ground voltage (e.g., DVSS) from the DVSS node (e.g., 204) based on the reference voltage (e.g., REFN).

The third transistor (e.g., M3) may be configured to remain a high impedance path to ground under the ESD condition and may provide the ground voltage (e.g., DVSS) from the DVSS node (e.g., 204) to the bottom gate based on the reference voltage (e.g., REFN) under the non-ESD condition (when there is no ESD zap and the reference voltage REFN is available, to turn off the transistor M6 and have the least current leakage from DVDD to DVSS).

At block 520, method 500 may fabricate a clamping stage configured to provide a first ESD clamp (e.g., M5) based on receiving the supply voltage (e.g., DVDD) from the top-gate node (e.g., 226). The clamping stage may be configured to provide a second ESD clamp (e.g., M6) based on receiving the supply voltage (e.g., DVDD) from the bottom-gate node (e.g., 228).

In some implementations, the clamping stage may be fabricated to include a third stage (e.g., 230) having a first clamping stage with a first clamping transistor and a second clamping stage with a second clamping transistor. The first clamping transistor may include a first clamping FET (e.g., M5) as a first ESD clamp having a first clamping effect, and the second clamping transistor may include a second clamping FET (e.g., M6) as a second ESD clamp having a second clamping effect.

Step 530 is described with reference to FIG. 3. At block 530, method 500 may integrate a coupling capacitor (e.g., the third capacitor C3) interposed between the bottom-gate node (e.g., 228) and the top-gate node (e.g., 226).

In some implementations, the coupling capacitor (e.g., C3) may be configured to receive the supply voltage (e.g., DVDD) from the top-gate (e.g., 226) to the bottom-gate (e.g., 228). The third capacitor (e.g., C3) may be interposed between a gate of the second clamping FET (e.g., M6) and a gate of the first clamping FET (e.g., M5). The third capacitor (e.g., C3) may be configured to create an additional path other than the transistor M2 path so that the top gate line 222 is coupled to the bottom-gate line 224 faster, thus increasing clamping efficiency.

Step 540 is described with reference to FIG. 4. At block 540, method 500 may integrate a regulating transistor (e.g., fourth transistor M4) configured to receive the reference voltage (e.g., REFN) and add this reference voltage to top-gate line 222, so that capacitor C3 does not have any gate-to-source or gate-to-drain voltage over stress in normal working condition (non-ESD) thus ensuring no reliability issue.

In some implementations, the fourth transistor (e.g., M4) may be sized so that during ESD condition, a reduced amount of current flows through the transistor M4 compared to the transistor M2 and the capacitor C3, thus not degrading the ESD efficiency.

In summary, to overcome deficiencies of conventional approaches, the ESD protection circuitry/circuits as described herein enable use of 1.8V CMOS devices for mixed I/O voltage devices (e.g., 3.3V, 2.5V, 1.8V) without adding manufacturing process steps or deep n-well layers to inhibit or even prevent increase in manufacturing costs. This may be achieved while ensuring gate-oxide reliability under high voltage (HV) operating conditions and reducing voltage overshoot during ESD triggering.

For instance, as described in FIGS. 2-4, the resistor R1, the first capacitor C1, and/or second capacitor C2 may be arranged to assist with defining an RC time constant of the RC detection stage (e.g., first stage 210). The first capacitor C1 and second capacitor C2 may be cascaded for voltage range compliance with REFN input from a voltage reference circuit generator (e.g., externally generated). This may ensure that a total high voltage (HV) may be distributed between the two stacked or cascaded capacitors C1 and C2, within their reliability limits. Alternatively, the REFN signal may be inherently generated. Further, in some instances, the RC triggering node 214 from the RC detection stage (i.e., the first stage 210) may be used within the trigger circuit to switch 'ON' the large cascaded LV NMOS transistors (e.g., FETs M5, M6) that are used as the power clamp (e.g., implemented as a power clamping stage).

For instance, an ESD zap may refer to a 4 A peak current representing a 250V CDM condition (charged device model condition). During ESD operation, if the ESD zap is applied from power to ground (e.g., from DVDD to DVSS), first and second capacitors C1, C2 may function as a short to DVSS to assist with preventing an immediate voltage rise to RC triggering node 214. With DVDD rising up due to the ESD zap, the first transistor M1 turns 'ON' and allows the top-gate node 226 to track DVDD. This may allow the second transistor M2 to turn 'ON' also. In this instance, under ESD, the REFN node 216 may behave similar to the RC triggering node 214 (e.g., which may be defined by the C1+C2 capacitor divider), and the REFN node 216 may remain initially shorted to DVSS before slowly rising due to the capacitive coupling of C1 and C2. Hence, the top-gate node 226 may start charging the bottom-gate node 228 through the second transistor (M2). In some instances, once both the top-gate node 226 and the bottom-gate node 228 have sufficient voltage levels, then the Big FET clamps M5 and M6 may be turned 'ON' to conduct the ESD current and restrict the power supply voltage DVDD to less than or equal to the ESD failure limit voltage of the exposed victim device. The clamping voltage may be determined by the ESD network implemented.

In some implementations, with this stacked approach, the bottom-gate node 228 maybe delayed from the top-gate node 226, because the second transistor M2 may turn 'ON' only when the voltage difference between the top-gate node 226 and REFN is sufficiently higher than Vth (|VGS|>|Vthp|), where Vth refers to a threshold voltage, $V_{GS}$ refers to gate-to-source voltage, and Vthp refers to a PMOS threshold voltage. This may result in slowing down the clamp triggering process, therefore possibly degrading clamping efficiency. For instance, ESD voltage may start discharging through the Big NMOS clamps M5 and M6 only when the bottom-gate node 228 reaches a certain voltage (e.g., approximately 1V). By this time, the clamp voltage may have already reached up to approximately 4V, where this high amount of ESD voltage may reduce a total ESD voltage budget on the network.

To avoid this occurrence, the third capacitor C3 may be introduced (as shown in FIGS. 3-4) to couple the top-gate signal 222 to the bottom-gate signal 224. During an initial period, the third capacitor C3 may assist the bottom-gate node 228 charging by the capacitor coupling from the top-gate line 222 to the bottom gate line 224 in addition to the active path defined by the second transistor M2. Further, in some instances, the addition of the third capacitor C3 may trigger the lower clamp M6 earlier by charging the bottom-gate node 228 faster. In this instance, e.g., an upper boundary voltage developed due to the CDM zap may be below the ESD failure boundary voltage of the exposed victim device.

In some circumstances, incorporation of the third capacitor C3 may create reliability issues as its gate-to-source voltage may see a voltage higher than 1.8V in steady state direct-current (DC) condition. For instance, the top-gate voltage 226 may settle somewhere between REFN (=1.8V) and REFN+|Vthp| through the second transistor M2. Further, when in steady state condition, the bottom-gate 228 may be grounded, and thus, the gate-oxide of the third capacitor C3 may be under DC stress, which may cause the gate-oxide of the third capacitor C3 to breakdown over time, thus possibly affecting reliability. Therefore, to overcome this issue, the fourth transistor M4 may be added to the clamp architecture (e.g., as shown in FIG. 4), which may assist in regulating the voltage at the top-gate node 226 the same as REFN (=1.8V) (and not in-between REFN and REFN+|Vthp|) in normal powered-up state. The fourth transistor M4 may be weakly sized so that, during ESD condition, a negligible amount of current flows through the fourth transistor M4 (e.g., thereby acting as high resistive path) to thereby reduce or inhibit any negative impact during ESD condition.

The discussion provided herein is directed to certain specific implementations. It should be understood that the discussion provided herein is provided for the purpose of enabling a person with ordinary skill in the art to make and use any subject matter defined herein by the subject matter of the claims.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve a developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
a resistor-capacitor (RC) detection stage having a resistor and a first capacitor cascaded with a second capacitor, the resistor and the first capacitor arranged to define a triggering node that provides a RC triggering signal, the first capacitor and the second capacitor arranged to define a reference node that provides a reference signal;
a first electrostatic discharge (ESD) clamping stage having a first transistor configured to provide a supply voltage to a first clamping field effect transistor (FET) based on the RC triggering signal from the triggering node;
a second ESD clamping stage having a second transistor configured to receive the supply voltage from the first transistor and provide the supply voltage to a second clamping FET based on the reference signal from the reference node; and
a top-gate node defined between the first transistor and the second transistor, wherein the first transistor is configured to provide the supply voltage to the first clamping FET via the top-gate node, and wherein the second transistor is configured to receive the supply voltage from the first transistor via the top-gate node.

2. The integrated circuit of claim 1, wherein:
each of the first and second transistors comprises a p-type metal-oxide-semiconductor (PMOS) transistor.

3. The integrated circuit of claim 1, wherein:
each of the first and second clamping FETs comprises a n-type metal-oxide-semiconductor (NMOS) FET.

4. An integrated circuit, comprising:
a resistor-capacitor (RC) detection stage having a resistor and a first capacitor cascaded with a second capacitor, the resistor and the first capacitor arranged to define a triggering node that provides a RC triggering signal, the first capacitor and the second capacitor arranged to define a reference node that provides a reference signal;
a first electrostatic discharge (ESD) clamping stage having a first transistor configured to provide a supply voltage to a first clamping field effect transistor (FET) based on the RC triggering signal from the triggering node; and
a second ESD clamping stage having a second transistor configured to receive the supply voltage from the first transistor and provide the supply voltage to a second clamping FET based on the reference signal from the reference node, wherein:
the second ESD clamping stage comprises a third transistor, under non-ESD condition, the third transistor is configured to provide a ground voltage to a bottom-gate node based on the reference signal from the reference node; and
under ESD condition, the third transistor remains in a high impedance state.

5. The integrated circuit of claim 4, further comprising:
a bottom-gate node defined between the second transistor and the third transistor, wherein the second transistor is configured to provide the supply voltage to the second clamping FET via the bottom-gate node.

6. The integrated circuit of claim 4, wherein:
the third transistor comprises a n-type metal-oxide-semiconductor (NMOS) transistor.

7. An integrated circuit, comprising:
a resistor-capacitor (RC) detection stage having a resistor and a first capacitor cascaded with a second capacitor, the resistor and the first capacitor arranged to define a triggering node that provides a RC triggering signal, the first capacitor and the second capacitor arranged to define a reference node that provides a reference signal;
a first electrostatic discharge (ESD) clamping stage having a first transistor configured to provide a supply voltage to a first clamping field effect transistor (FET) based on the RC triggering signal from the triggering node;
a second ESD clamping stage having a second transistor configured to receive the supply voltage from the first transistor and provide the supply voltage to a second clamping FET based on the reference signal from the reference node; and
a third capacitor interposed between a gate of the second clamping FET and a gate of the first clamping FET, wherein the third capacitor is configured to receive the supply voltage from the first clamping FET at a top-gate node to the second clamping FET at a bottom-gate node by capacitive coupling in addition to a signal coming from a second transistor in the first ESD clamping stage.

8. The integrated circuit of claim 7, wherein:
the third capacitor comprises a p-type metal-oxide-semiconductor (PMOS) transistor interconnected to function as a capacitor.

9. The integrated circuit of claim 4, further comprising:
a fourth transistor configured to receive the supply voltage from the first transistor and add the supply voltage to the reference signal based on the RC triggering signal from the triggering node.

10. The integrated circuit of claim 9, wherein:
the fourth transistor comprises a n-type metal-oxide-semiconductor (NMOS) transistor.

11. An integrated circuit, comprising:
a resistor-capacitor (RC) detection stage having a resistor and a first capacitor cascaded with a second capacitor, the resistor and the first capacitor arranged to define a triggering node that provides a RC triggering signal, the first capacitor and the second capacitor arranged to define a reference node that provides a reference signal;
a first electrostatic discharge (ESD) clamping stage having a first transistor configured to provide a supply voltage to a first clamping field effect transistor (FET) based on the RC triggering signal from the triggering node; and
a second ESD clamping stage having a second transistor configured to receive the supply voltage from the first transistor and provide the supply voltage to a second clamping FET based on the reference signal from the reference node, wherein:
the supply voltage provides a first power supply voltage, the reference signal provides a second power supply voltage less than the first power supply voltage, each of the first and second ESD clamping stages utilize circuit components configured for operating with the first and second power supply voltages, and none of the component's gate-to-source or gate-to-drain voltages exceed the second power supply voltage.

12. An integrated circuit, comprising:
a resistor-capacitor (RC) detection stage having a resistor and a first capacitor cascaded with a second capacitor, the resistor and the first capacitor arranged to define a triggering node that provides a RC triggering signal, the first capacitor and the second capacitor arranged to define a reference node that provides a reference signal;
a first electrostatic discharge (ESD) clamping stage having a first transistor configured to provide a supply voltage to a first clamping field effect transistor (FET) based on the RC triggering signal from the triggering node; and
a second ESD clamping stage having a second transistor configured to receive the supply voltage from the first transistor and provide the supply voltage to a second clamping FET based on the reference signal from the reference node, wherein:
the supply voltage comprises a high voltage (HV) power supply having an upper boundary voltage of 3.3V, the reference signal comprises a low voltage (LV) power supply having an upper boundary voltage of 1.8V, and each of the first and second ESD clamping stages utilize LV circuit components configured for operating with an upper boundary voltage of 1.8V.

13. An integrated circuit, comprising:
a resistor-capacitor (RC) detection stage having a resistor and a first capacitor cascaded with a second capacitor, the resistor and the first capacitor arranged to define a triggering node that provides a RC triggering signal, the first capacitor and the second capacitor arranged to define a reference node that provides a reference signal;

a first electrostatic discharge (ESD) clamping stage having a first transistor configured to provide a supply voltage to a first clamping field effect transistor (FET) based on the RC triggering signal from the triggering node; and a second ESD clamping stage having a second transistor configured to receive the supply voltage from the first transistor and provide the supply voltage to a second clamping FET based on the reference signal from the reference node, wherein:

the supply voltage comprises a medium voltage (MV) power supply having an upper boundary voltage of 2.5V, the reference signal comprises a low voltage (LV) power supply having an upper boundary voltage of 1.8V, and each of the first and second ESD clamping stages utilize LV circuit components configured for operating with having an upper boundary voltage of 1.8V.

14. An electrostatic discharge (ESD) protection circuit, comprising:

a detection stage configured to provide a supply voltage to a top-gate node based on a resistor-capacitor (RC) triggering voltage and configured to provide the supply voltage to a bottom-gate node via the top-gate node based on a reference voltage;

a clamping stage configured to provide a first ESD clamp in response to receiving the supply voltage from the top-gate node and configured to provide a second ESD clamp in response to receiving the supply voltage from the bottom-gate node;

a coupling capacitor interposed between the bottom-gate node and the top-gate node, the coupling capacitor being configured to receive the supply voltage from the top-gate node to the bottom-gate node; and a regulating transistor configured to receive the supply voltage from the top-gate node and add the supply voltage to the reference voltage based on the RC triggering voltage.

15. An electrostatic discharge (ESD) protection circuit, comprising:

a detection stage configured to provide a supply voltage to a top-gate node based on a resistor-capacitor (RC) triggering voltage and configured to provide the supply voltage to a bottom-gate node via the top-gate node based on a reference voltage;

a clamping stage configured to provide a first ESD clamp in response to receiving the supply voltage from the top-gate node and configured to provide a second ESD clamp in response to receiving the supply voltage from the bottom-gate node; and a coupling capacitor interposed between the bottom-gate node and the top-gate node, the coupling capacitor being configured to receive the supply voltage from the top-gate node to the bottom-gate node, wherein:

the detection stage includes a first stage including a resistor, a first capacitor, and a second capacitor, the resistor and the first capacitor being arranged to provide the RC triggering voltage, the first capacitor and the second capacitor being arranged to provide the reference voltage, the detection stage includes a second stage comprising a first transistor configured to provide the supply voltage to the top-gate node based on the RC triggering voltage, a second transistor configured to receive the supply voltage from the top-gate node and provide the supply voltage to the bottom-gate node based on the reference voltage, and a third transistor configured to receive the supply voltage from the bottom-gate node based on the reference voltage, and the clamping stage comprises a first clamping transistor as the first ESD clamp and a second clamping transistor as the second ESD clamp.

16. An electrostatic discharge (ESD) protection circuit, comprising:

a detection stage configured to provide a supply voltage to a top-gate node based on a resistor-capacitor (RC) triggering voltage and configured to provide the supply voltage to a bottom-gate node via the top-gate node based on a reference voltage;

a clamping stage configured to provide a first ESD clamp in response to receiving the supply voltage from the top-gate node and configured to provide a second ESD clamp in response to receiving the supply voltage from the bottom-gate node; and a regulating transistor configured to receive the supply voltage from the top-gate node and add the supply voltage to the reference voltage based on the RC triggering voltage.

17. The ESD protection circuit of claim 16, further comprising:

a second transistor configured to receive the supply voltage from the top-gate node and provide the supply voltage to the bottom-gate node based on the reference voltage; and a coupling capacitor interposed between the bottom-gate node and the top-gate node, the coupling capacitor configured to receive the supply voltage from the top-gate node to the bottom-gate node along with an active second transistor path which adds supply voltage to bottom-gate node based on the reference voltage.

18. The ESD protection circuit of claim 16, wherein:

the detection stage includes a first stage including a resistor, a first capacitor, and a second capacitor, the resistor and the first capacitor being arranged to provide the RC triggering voltage, the first capacitor and the second capacitor being arranged to provide the reference voltage, the detection stage includes a second stage having a first transistor configured to provide the supply voltage to the top-gate node based on the RC triggering voltage, a second transistor configured to receive the supply voltage from the top-gate node and provide the supply voltage to the bottom-gate node based on the reference voltage, and a third transistor configured to receive the supply voltage from the bottom-gate node based on the reference voltage, and the clamping stage comprises a first clamping transistor as the first ESD clamp and a second clamping transistor as the second ESD clamp.

\* \* \* \* \*